(12) United States Patent
Lee

(10) Patent No.: US 8,760,332 B2
(45) Date of Patent: Jun. 24, 2014

(54) DIGITAL-ANALOG CONVERSION APPARATUS AND METHOD

(71) Applicant: Samsung Electronics Co. Ltd., Suwon-si (KR)

(72) Inventor: Jong-Woo Lee, Seungnam-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 13/705,550

(22) Filed: Dec. 5, 2012

(65) Prior Publication Data

US 2013/0141265 A1    Jun. 6, 2013

(30) Foreign Application Priority Data

Dec. 6, 2011    (KR) .......................... 10-2011-0129551

(51) Int. Cl.
  *H03M 1/66*    (2006.01)
(52) U.S. Cl.
  USPC ............ 341/144; 341/135; 341/145; 341/153
(58) Field of Classification Search
  USPC .................................. 341/135, 144, 145, 153
  See application file for complete search history.

(56) References Cited

U.S. PATENT DOCUMENTS

| | | | | |
|---|---|---|---|---|
| 5,844,511 | A * | 12/1998 | Izumikawa | 341/136 |
| 6,046,692 | A | 4/2000 | Yamashiro et al. | |
| 6,154,121 | A | 11/2000 | Cairns et al. | |
| 6,362,764 | B1 * | 3/2002 | Niimi et al. | 341/144 |
| 6,433,721 | B2 * | 8/2002 | Katada | 341/144 |
| 6,556,161 | B2 | 4/2003 | Nuijten | |
| 7,015,847 | B1 * | 3/2006 | McLachlan et al. | 341/145 |
| 7,019,677 | B1 * | 3/2006 | Soman et al. | 341/144 |
| 7,148,827 | B2 * | 12/2006 | Lee | 341/118 |
| 7,312,740 | B2 * | 12/2007 | Chou | 341/145 |
| 7,345,612 | B2 * | 3/2008 | Eloranta et al. | 341/153 |
| 7,812,751 | B2 * | 10/2010 | Eloranta et al. | 341/144 |
| 8,013,772 | B2 * | 9/2011 | Li | 341/154 |
| 8,542,773 | B2 * | 9/2013 | Yu et al. | 375/302 |
| 2011/0012519 | A1 | 1/2011 | Zhao | |
| 2011/0227770 | A1 * | 9/2011 | Kaper et al. | 341/120 |

FOREIGN PATENT DOCUMENTS

| | | | |
|---|---|---|---|
| EP | 1001534 | A2 | 5/2000 |
| EP | 1211812 | A2 | 6/2002 |

* cited by examiner

*Primary Examiner* — Linh Nguyen
(74) *Attorney, Agent, or Firm* — Jefferson IP Law, LLP

(57) ABSTRACT

An apparatus and a method for digital-analog conversion are provided. The apparatus includes a first cell matrix for outputting a current of a signal corresponding to a number of Most Significant Bits (MSBs) of an input digital signal, a second cell matrix for outputting a current of a signal corresponding to a number of Least Significant Bits (LSBs) of the input digital signal, an amplifier for amplifying the output current of the second cell matrix at a preset amplification, and an adder for adding the output current of the first cell matrix and the output current of the amplifier.

18 Claims, 2 Drawing Sheets

DIGITAL-ANALOG CONVERSION APPARATUS AND METHOD

PRIORITY

This application claims the benefit under 35 U.S.C. §119(a) of a Korean patent application filed on Dec. 6, 2011 in the Korean Intellectual Property Office and assigned Serial No. 10-2011-0129551, the entire disclosure of which is hereby incorporated by reference.

BACKGROUND OF THE INVENTION

1. Field of the Invention

The present invention relates to a digital-analog converter for converting a digital signal to an analog signal.

2. Description of the Related Art

As digital signal processing techniques advance, signal processing techniques for converting an analog signal into a digital signal and converting the digital signal back into the analog signal are widely used and amounts of data processing used by various wired and wireless communication systems using the signal processing is increasing. Hence, an amount of digital signals to be converted to analog signals is increasing, and a digital-analog converter having a high conversion speed and high resolution is needed.

Digital-analog converters which sample an input signal at a Nyquist rate are provided by related art. Such digital-analog converters may achieve high resolution in theory as a number of bits increases, but it is difficult to attain a high resolution over 6 bits because of distortion arising from fabrication error. Digital-analog converters which produce the analog signal by combining current cells according to the input bits are also provided by the related art. The combination of the current cells allows for relatively low fabrication error and thus realizes a digital-analog converter of high resolution bits. However, an N-bit digital-analog converter requires $2^N-1$-ary current cells. Accordingly, the more bits, the more current cells needed. Furthermore, as the number of the current cells increases, a total area of the digital-analog converter expands and thus an Integrated Non-Linearity (INL) error may increase.

Accordingly, a related art method may reduce the INL error by randomly changing a pointer according to an input signal level every hour and using a different current cell every hour. However, the related art method may not reduce a Differential Non-Linearity (DNL) error indicating an error between the current cells, and thus reliability of the output signal per hour may be degraded. Furthermore, when a high-resolution digital-analog converter over 10 bits is realized using the related art method, more than 1,023 cells are necessary. As a result, implementing a circuit for randomly using more than 1,023 cells may need a complicated manufacturing process and a manufacturing cost rises due to the increase of the total area of the digital-analog converter.

Therefore, a need exists for a system and method for a digital-analog converter having a high conversion speed and high resolution.

The above information is presented as background information only to assist with an understanding of the present disclosure. No determination has been made, and no assertion is made, as to whether any of the above might be applicable as prior art with regard to the present invention.

SUMMARY OF THE INVENTION

Aspects of the present invention are to address at least the above-mentioned problems and/or disadvantages and to provide at least the advantages described below. Accordingly, an aspect of the present invention is to provide an apparatus and a method of a digital-analog converter.

Another aspect of the present invention is to provide an apparatus of a digital-analog converter including a cell matrix which divides an input digital signal into two or more groups and outputs a current of each group, and a method of the digital-analog converter.

Yet another aspect of the present invention is to provide a method and an apparatus for reducing an Integrated Non-Linearity (INL) error and a Differential Non-Linearity (DNL) error using a cell matrix which drives a plurality of cells arranged symmetrically for arbitrary input bits in a digital-analog converter.

Still another aspect of the present invention is to provide a method and an apparatus for estimating a fabrication error and correcting the estimated error in an initial driving of a digital-analog converter.

In accordance with an aspect of the present invention, an apparatus for digital-analog conversion is provided. The apparatus includes a first cell matrix for outputting a current of a signal corresponding to a number of Most Significant Bits (MSBs) of an input digital signal, a second cell matrix for outputting a current of a signal corresponding to a number of Least Significant Bits (LSBs) of the input digital signal, an amplifier for amplifying the output current of the second cell matrix at a preset amplification, and an adder for adding the output current of the first cell matrix and the output current of the amplifier.

In accordance with another aspect of the present invention, a method of a digital-analog converter is provided. The method includes dividing an input digital signal into a Most Significant Bit (MSB) signal corresponding to a number of MSBs and a Least Significant Bit (LSB) signal corresponding to a number of LSBs, outputting a current for the MSB signal using a first cell matrix, outputting a current for the LSB signal using a second cell matrix, amplifying the output current using the second cell matrix at a preset amplification, and adding the output current of the first cell matrix and the amplified output current and outputting a result of the adding.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

Exemplary embodiments of the present invention provide an apparatus and a method of a digital-analog converter including a cell matrix which divides an input digital signal to two or more groups and outputs a current of each group. Hereinafter, to ease the understanding, a digital-analog converter for current regulation is explained by way of example. Notably, a cell matrix structure of the present invention is equally applicable to other digital-analog converters using the cell matrix. To facilitate the understanding, an input digital signal is divided into a certain number of Most Significant Bits (MSBs) and a certain number of Least Significant Bits (LSBs) by way of example. The present method can be equally applied to the input digital signal which is divided into two or more groups.

Figure 1:
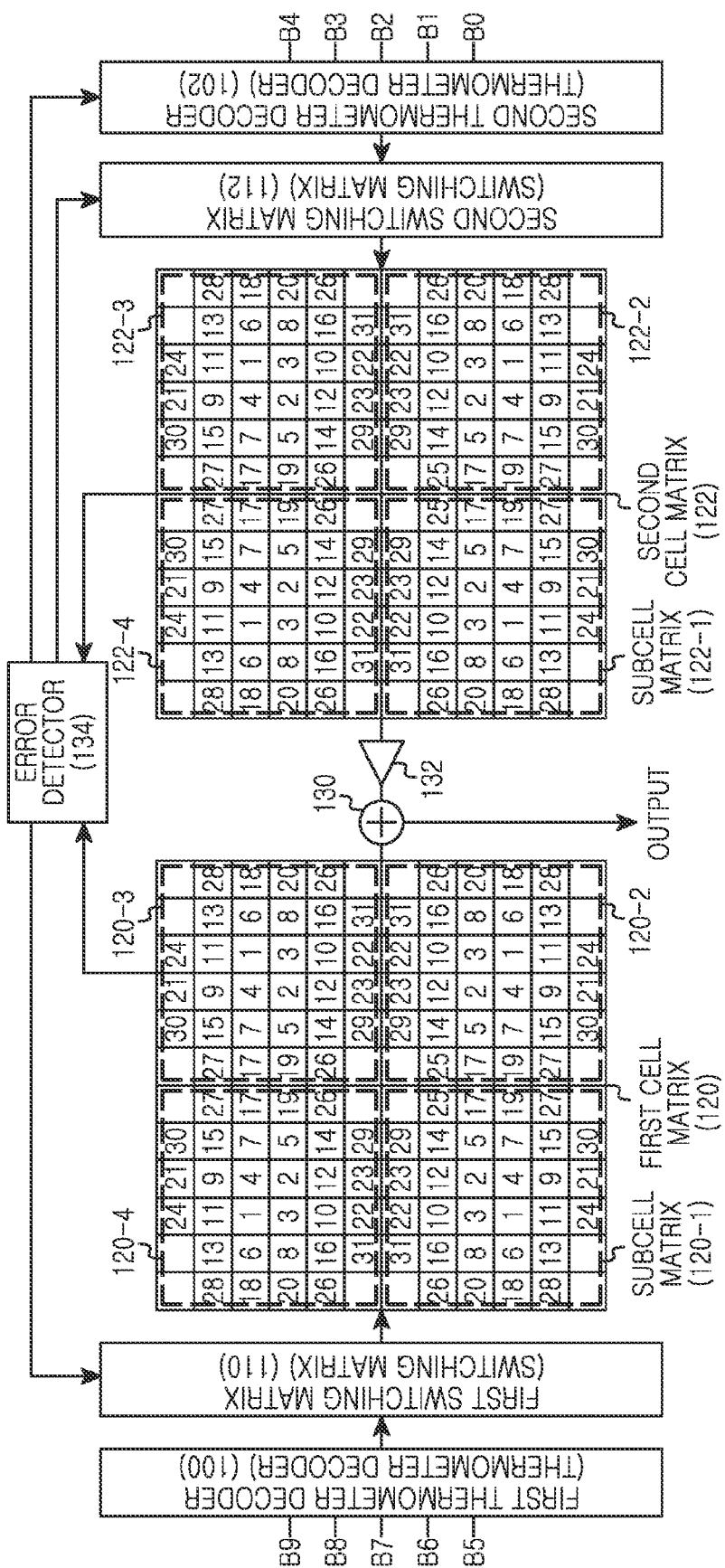
FIG. 1 illustrates a digital-analog converter according to an exemplary embodiment of the present invention.

FIG. 1 illustrates a digital-analog converter according to an exemplary embodiment of the present invention.

Referring to FIG. 1, the digital-analog converter includes a first thermometer decoder 100 for processing a signal of the certain number of the MSBs, a first switching matrix 110, a first cell matrix 120, a second thermometer decoder 102 for processing a signal of the certain number of the LSBs, a second switching matrix 112, a second cell matrix 122, an amplifier 132, an adder 130, and an error detector 134. With respect to the digital-analog converter of FIG. 1, an input K-bit digital signal is divided into N-ary MSBs and M-ary LSBs, and K=10, N=5, and M=5. Notably, the MSBs N and the LSBs M may be set to different values according to a design and thus a number of current cells of a cell matrix may vary, as will be described below.

The first thermometer decoder 100 may convert the input N-bit digital signal, which is generated from the K-bit digital signal which is input to the digital-analog converter, into a signal of $2^N-1$-ary consecutive bits, and outputs the converted bit signal to the first switching matrix 110. For example, when a 5-bit MSB signal of "00011" is input, the first thermometer decoder 100 may convert "00011" into a signal of $31(2^5-1)$-ary consecutive bits that is "0000000000000000000000000000111". Furthermore, when a 5-bit MSB signal of "00101" is input, the first thermometer decoder 100 may convert "00101" into a signal of $31(2^5-1)$-ary consecutive bits that is "0000000000000000000000000011111". The consecutive bit values may be output in parallel to correspond with a plurality of switches (not shown) of the first switching matrix 110.

The first switching matrix 110 may include switches (not shown) for a plurality of cells of the first cell matrix 120, and thus, may supply or cut-off a current source of the cells. That is, the first switching matrix 110 may determine a cell to which the current source is supplied according to the consecutive-bit signal output from the first thermometer decoder 100, and may turn a switch of the corresponding cell ON or OFF. In particular, for a one-bit signal, the first switching matrix 110 may controls the current source supply of four symmetric cells in the first cell matrix 120. For example, when a signal corresponding to "0000000000000000000000000000011" is input to the first switching matrix 110 from the first thermometer decoder 100, then the first switching matrix 110 may recognize two bits having the value '1' and may control supplying of the current source by switching two cells in each of four subcell matrixes 120-1 through 120-4 ON or OFF, wherein the four subcell matrixes 120-1 through 120-4 are symmetrical to each other in both a vertical direction and a horizontal direction. That is, first and second cells of each of the four subcell matrixes 120-1 through 120-4 may be switched to an ON or OF state.

In order to determine the cell to which the current source is supplied according to the input signal bits, the first switching matrix 110 may determine the cell according to a predefined procedure or at random. Notably, the first switching matrix 110 may control the current source to be simultaneously supplied to or cut-off from the symmetric cells of the four subcell matrixes 120-1 through 120-4. In other words, the first switching matrix 110 may cut-off the current source for only some of the symmetric cells of the four subcell matrixes 120-1 through 120-4, or the current source may be supplied to the symmetric cells at different times. When the first switching matrix 110 is initially turned on, it may conduct the switching to supply the current source to one of the cells of the first cell matrix 120 according to a request of the error detector 134 so as to detect a fabrication error.

The first cell matrix 120 may output a current corresponding to the N-MSB digital signal that is generated from the K-bit digital signal which is input to the digital-analog converter. The first cell matrix 120 may include the four subcell matrixes 120-1 through 120-4, which are symmetrical to each other in both in the vertical direction and the horizontal direction. The subcell matrixes 120-1 through 120-4 each include $2^N-1$-ary current cells. The cells may output the same current when the current source is supplied to the cells of the first cell matrix 120.

The second thermometer decoder 102 may convert the input M-bit digital signal, which is generated from the K-bit digital signal which is input to the digital-analog converter, into a signal of $2^M-1$-ary consecutive bits, and may output the converted bit signal to the second switching matrix 112. For example, when a 5-bit LSB signal of "00110" is input, the second thermometer decoder 102 may convert "00110" to a signal of 31 consecutive bits that is "0000000000000000000000000111111". Accordingly, the consecutive bit values may be output in parallel so as to correspond with a plurality of switches of the second switching matrix 112. In particular, the second thermometer decoder 102 may correct a fabrication error by adding or subtracting a digital bit, which indicates the fabrication error, to or from the input M-bit digital signal value under control of the error detector 134. For example, under the control of the error detector 134, the second thermometer decoder 102 may correct the input 5-bit LSB signal "00110" to be "00111" by adding 1 and may convert to the consecutive 31-bit signal corresponding to "00111", or may correct the input 5-bit LSB signal "00110" to be "00101" by subtracting 1 and convert to the consecutive 31-bit signal corresponding to "00101".

The second switching matrix 112 may include a plurality of switches for a plurality of cells of the second cell matrix 122, and thus may supply or cut-off the current source of the cells. That is, the second switching matrix 112 may determine a cell to supply the current source according to the consecutive-bit signal output from the second thermometer decoder 102, and may turn ON or OFF the switch of the corresponding cell. In particular, the second switching matrix 112 may control the current source supply of four symmetric cells of the second cell matrix 122. For example, when a signal corresponding to "0000000000000000000000000111111" is input from the second thermometer decoder 102 to the second switching matrix 112, then the second switching matrix 112 may recognize six bits having the value '1' and may control supplying of the current source by switching six cells in each of four symmetric subcell matrixes 122-1 through 122-4, which are the first through sixth cells of the four subcell matrixes 122-1 through 122-4. In order to determine the cell that the current source is supplied to according to the input signal bits, the second switching matrix 112 may determine the cell according to a predefined procedure or at random. The second switching matrix 112 may control the current source to be simultaneously supplied to or cut-off from the symmetric cells of the four subcell matrixes 122-1 through 122-4. Additionally, when the second switching matrix 112 is initially turned on, it may conduct the switching to supply the current source to a certain number of cells from among the cells of the second cell matrix 122 according to a request of the error detector 134 so as to detect the fabrication error.

The second cell matrix 122 may output the current corresponding to the M-bit digital signal, which is for the LSBs and is generated from the K-bit digital signal which is input to the digital-analog converter. The second cell matrix 122 may include the four subcell matrixes 122-1 through 122-4 which are symmetric to each other in both the vertical direction and the horizontal direction. The subcell matrixes 122-1 through 122-4 may each include $2^M-1$-ary current cells. In a case where the current source is supplied to the cells of the second cell matrix 122, then the cells output the same current. Additionally, in such a case, all of the cells of the second cell matrix 122 and the first cell matrix 120 output the same current. Furthermore, the subcell matrixes 122-1 through 122-4 of the second cell matrix 120 may further include cells in addition to the $2^M-1$-ary current cells so as to correct the fabrication error.

The amplifier 132 may amplify the current output from the second cell matrix 122 at a preset amplification or at any suitable amplification, and may output the amplified current. In so doing, the amplification may be determined by the number M of the LSBs. That is, the amplifier 132 may amplify the current output from the second cell matrix 122 at the amplification of $$\frac{1}{2^M}.$$

Herein, the output current of the second cell matrix 122 may be amplified according to the number M of the LSBs because the output current of the cells of the first cell matrix 120 may be M times greater than the output current of the cells of the second cell matrix 122, wherein the output currents may be different because the N-MSB signal is input to the first cell matrix 120 and the M-LSB signal is input to the second cell matrix 122 while the cells of the first cell matrix 120 and the cells of the second cell matrix 122 output the same current. Thus, the signal may be attenuated using an attenuator (not shown), instead of the amplifier 132, at a preset attenuation, or any suitable attenuation, according to the design. The output current of the first cell matrix 120 may be amplified $2^M$ times, rather than regulating the output current of the second cell matrix 122.

The adder 130 may add the output current of the first cell matrix 120 and the amplified current output from the second cell matrix 122 in order to provide the output of the digital-analog converter. The adder 130 may be configured to add the output and amplified current of the second cell matrix 122 to the output current of the first cell matrix 120 using a current mirror (not shown). However, the present invention is not limited thereto, and the adder 130 may add signals and/or currents in any suitable manner.

The error detector 134 may detect the error in the fabrication, i.e., the fabrication error, and may correct a signal by considering the detected error. Particularly, the error detector 134 may detect the fabrication error using a property of the digital-analog converter of the present exemplary embodiments, wherein the current value output from one unit cell of the first cell matrix 120 should be equal to the current value produced by amplifying the output currents of all of the cells of the second cell matrix 122 at the preset amplification. The unit cell may include the symmetric cells in the corresponding cell matrix. For example, the first unit cell of the first cell matrix 120 may include the first cell of the first subcell matrix 120-1, the first cell of the second subcell matrix 120-2, the first cell of the third subcell matrix 120-3, and the first cell of the fourth subcell matrix 120-4.

Accordingly, when the digital-analog converter is turned on, the error detector 134 may output a control signal to the first switching matrix 110 and the second switching matrix 112, wherein the control signal corresponds to the fabrication error correction, and then the error detector 134 may receive the current output from one unit cell of the first cell matrix 120, may receive the current amplified at the preset amplification from the second cell matrix 122, may compare the two currents, and thus, the error detector 134 may detect the error. In so doing, the first cell matrix 120 may output the current of the corresponding unit cell by driving one unit cell, which may be arbitrarily selected, by the control signal of the error detector 134. By contrast, the second cell matrix 122 may change the number of the unit cells driven by the control signal of the error detector 134 and may output the current according to the number of the driven unit cells. Thus, the error detector 134 may compare the current fed from the first cell matrix 120 and the current fed from the second cell matrix 122 using a comparator (not shown), and thus the error detector 134 may detect the fabrication error based on the number of the driving unit cells of the second cell matrix 122 corresponding to the time when the two currents are equal, which is also the time when the output result of the comparator changes.

For example, the current amount of the first unit cell of the first cell matrix 120 should be equal to the current amount of the 31 first unit cells of the second cell matrix 122. When the second cell matrix 122 drives 29 unit cells, the comparator may output a low value. However, when the second cell matrix 122 drives 30 unit cells, the comparator may output a high value. In such a case, the error detector 134 may determine that the current amount that is output when the second cell matrix 122 drives the 30 unit cells is equal to the current amount output when the first cell matrix 120 drives one unit cell. Accordingly, since the output current amount of all of the cells of the second cell matrix 122 is greater than the unit cell current amount of the first cell matrix 120, then the error detector 134 may decrease the output current of the second cell matrix 122 for the correction. The error detector 134 may correct the output current by subtracting 1 from the input digital signal in the second thermometer decoder 102 of the second cell matrix 122 and may drive the unit cells which are one unit cell smaller than the unit cells corresponding to the input digital signal in the second cell matrix 122, or may correct the output current by regulating a bias current source supplied to the second cell matrix 122.

For example, in a case where the second cell matrix 122 drives the 31 unit cells and the comparator outputs the low value, the second cell matrix 122 may drive additional cells besides the 31 cells. Accordingly, when the second cell matrix 122 drives 32 unit cells in total including the 31 unit cells and the additional unit cell and the comparator outputs the high value, the error detector 134 may determine that the current amount output when the second cell matrix 122 drives the 32 unit cell is equal to the current amount output when the first cell matrix 120 drives one unit cell. Since the output current amount of the second cell matrix 122 may be smaller than the unit cell current amount of the first cell matrix 120, the error detector 134 may increase the output current of the second cell matrix 122 for the correction. The error detector 134 may correct the output current by adding 1 to the input digital signal in the second thermometer decoder 102 for the second cell matrix 122 and may drive the unit cells which are one unit cell greater than the unit cells corresponding to the input digital signal in the second cell matrix 122, or the error detector 134 may correct the output current by regulating a bias current source supplied to the second cell matrix 122.

While each cell matrix may include four subcell matrixes as illustrated in FIG. 1, any of the cell matrixes may include only one subcell matrix, two vertically symmetric subcell matrixes, or two horizontally symmetric subcell matrixes according to its design.

Referring to FIG. 1, the input signal may be divided into the two groups for example. In a case where the input signal is divided into three groups, the digital-analog converter may use thermometer decoders, switching matrixes, and cell matrixes for the three groups, respectively, and may use an amplifier or an attenuator for regulating the output currents of the cell matrixes for two groups from among the cell matrix output of the three groups. The digital-analog converter may also use an adder for adding the outputs of the cell matrixes of the three groups, and may use an error detector for estimating the fabrication error.

Figure 2:
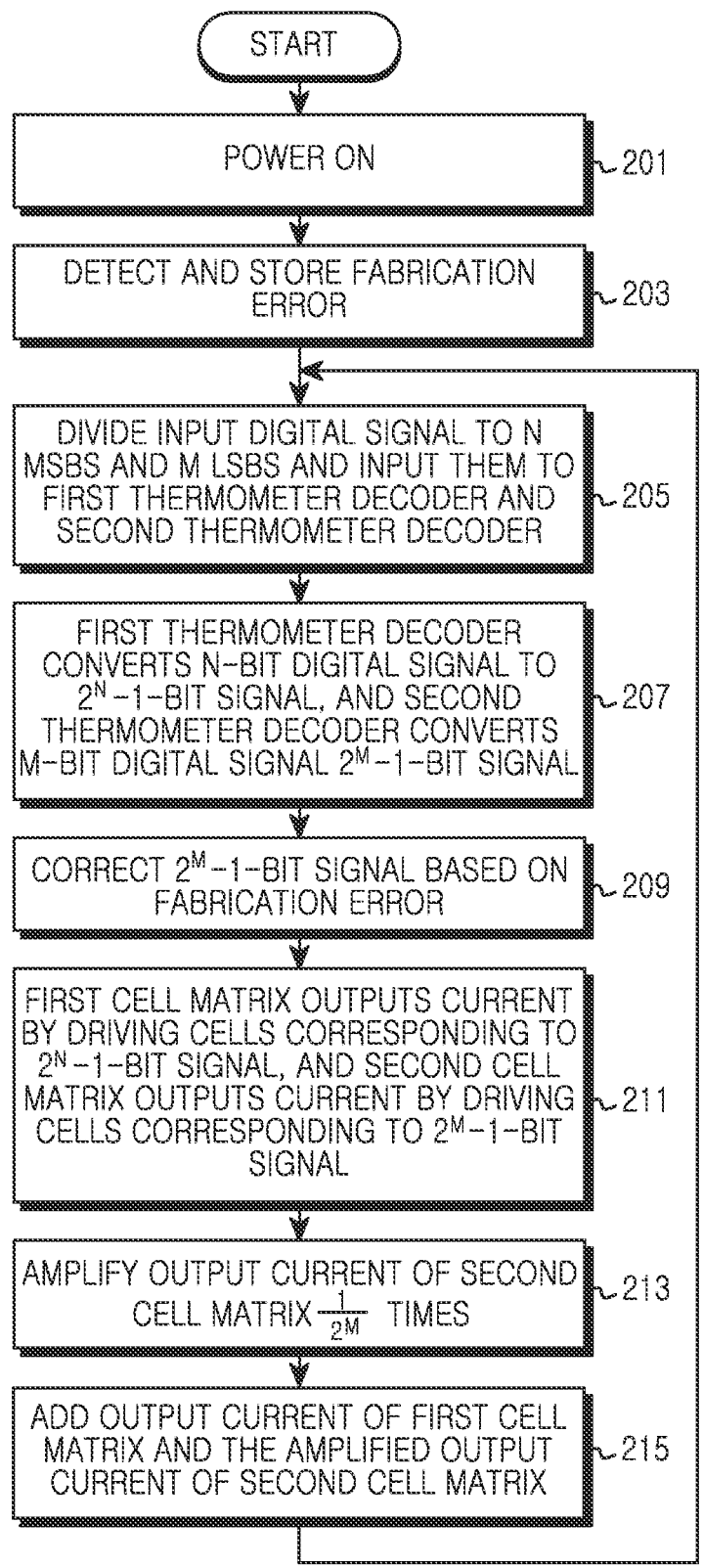
FIG. 2 illustrates operations of the digital-analog converter according to an exemplary embodiment of the present invention.

FIG. 2 illustrates operations of a digital-analog converter according to an exemplary embodiment of the present invention.

Referring to FIG. 2, it may be assumed that the digital-analog converter includes the two cell matrixes which divides and processes the K-bit input digital signal into the N MSBs and the M LSBs as shown in FIG. 1. However, the present invention is not limited thereto, and there may be more than two cell matrixes included in the digital-analog converter of FIG. 2. In operation 201 the digital-analog converter is turned on, and then, in operation 203, it may detect and store a fabrication error. The fabrication error may indicate an error caused by a variety of factors, such as silicon thickness or texture, when the digital-analog converter is designed. The digital-analog converter may define a reference current by driving one unit cell in the first cell matrix 120, output the current while changing the number of the unit cells driven in the second cell matrix 120, amplify the output current at the preset amplification, and compare values or amounts of the amplified current and the reference current, and thus, the digital-analog converter may detect the fabrication error. The fabrication error may be determined according to a difference between the number of the unit cells driven in the second cell matrix 122 and the number $2^M-1$ of the unit cells of the second cell matrix 122 when the current of the second cell matrix 122, as output and amplified, becomes equal to the reference current. For example, when the second cell matrix 122 including the 31 unit cells drives 30 unit cells and the current that is output and amplified is equal to the reference current, then the fabrication error may be −1 LSB. In a case where the second cell matrix 122, which includes the 31 unit cells, drives the 31 unit cells and further drives one additional unit cell, which is used for an exceptional situation, and the current that is output and amplified is equal to the reference current, then the fabrication error may be +1 LSB.

Next, in operation 205, the digital-analog converter may divide the input digital signal into the N MSBs and the M LSBs, and then may input the digital signal of the N MSBs to the first thermometer decoder 100 and input the digital signal of the M LSBs to the second thermometer decoder 102. In operation 207, the digital-analog converter may convert the digital signal of the N MSBs to the signal of the consecutive $2^N-1$-ary bits via the first thermometer decoder 100, and may convert the digital signal of the M LSBs to the signal of the consecutive $2^M-1$-ary bits via the second thermometer decoder 102. For example, in a case where the digital signal input to the digital-analog converter is 10-bit "0010101111", the digital-analog converter may split the 10-bit digital signal into the 5 MSBs "00101" and the 5 LSBs "01111", may convert the 5 MSBs "00101" into the signal of $31(2^5-1)$-ary consecutive bits that is "00000000000000000000000000011111", and may convert the 5 LSBs "01111" to the signal of $31(2^5-1)$-ary consecutive bits that is "00000000000000000111111111111111". Herein, the signal of the $31(2^5-1)$-ary consecutive bits may indicate the number of the cells that are to be driven in the corresponding cell matrix.

Next, in operation 209, the digital-analog converter may correct the signal of the consecutive $2^M-1$-ary bits of the M LSBs by considering the detected fabrication error. For example, in a case where the fabrication error detected in operation 203 is −1, the digital-analog converter may determine to drive the unit cells with one less cell. In order to do so, the digital-analog converter may convert the consecutive-bit signal that is "00000000000000000111111111111111" into a consecutive bit signal that is "00000000000000000011111111111111". For example, before converting the digital signal of the M LSBs to the signal of the consecutive $2^M-1$-ary bits, the digital-analog converter may subtract 1 from the digital signal of the M LSBs and may convert the subtraction result to the signal of the consecutive $2^M-1$-ary bits.

In operation 211, the digital-analog converter may output the current by driving a number of the unit cells that corresponds to the number indicated by the signal of the consecutive $2^N-1$-ary bits in the first cell matrix 120, and may output the current by driving another number of the unit cells that corresponds to the number indicated by the signal of the consecutive $2^M-1$-ary bits in the second cell matrix 122. Accordingly, the unit cells of the first cell matrix 120 and the unit cells of the second cell matrix 122 are driven at the same time according to a reference clock under the control of the respective switching matrixes 110 and 112.

In operation 213, the digital-analog converter may amplify the output current of the second cell matrix 122 at the preset amplification of $$\frac{1}{2^M}.$$

Accordingly, the output current of the second cell matrix 122 may be amplified because the output current of the cells of the first cell matrix 120 may be M times greater than the output current of the cells of the second cell matrix 122 since the N-bit digital signal of MSBs may be input to the first cell matrix 120 and the M-bit digital signal of LSBs may input to the second cell matrix 122 while the cells of the first cell matrix 120 and the cells of the second cell matrix 122 output the same current. Thus, the digital-analog converter may attenuate the signal of the second cell matrix 122 at the preset attenuation according to the design. The digital-analog converter may amplify the output current of the first cell matrix 120 by $2^M$ times, rather than regulating the output current of the second cell matrix 122.

Next, in operation 215, the digital-analog converter may add the output current of the first cell matrix 120 and the current that is output and amplified by the second cell matrix 122. Next, the digital-analog converter returns to operation 205. While the thermometer decoder 102 may correct the fabrication error by controlling the digital signal, as illustrated in FIG. 2, the fabrication error may also be corrected by controlling the bias current source supplied to the second cell matrix 122.

As set forth above, the digital-analog converter may include two or more cell matrixes for dividing and processing the input digital signal into two or more groups. Thus, a total area of the digital-analog converter may be reduced by decreasing the number of the unit cells as compared to the number of the input bits, and thus, manufacturing costs may be decreased as compared to a related art digital-analog converter. Furthermore, the cell matrix may drive the plurality of the symmetric cells for arbitrary input bits, may estimate a fabrication error at an initial driving of the cell matrix, and may then correct estimates of the fabrication error. Therefore, an Integrated Non-Linearity (INL) error and a Differential Non-Linearity (DNL) error may be reduced and a digital-analog converter of high resolution may be realized.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. An apparatus for digital-analog conversion, the apparatus comprising:
   a first cell matrix configured to output a current of a signal corresponding to a number of Most Significant Bits (MSBs) of an input digital signal;
   a second cell matrix configured to output a current of a signal corresponding to a number of Least Significant Bits (LSBs) of the input digital signal;
   an amplifier configured to amplify the output current of the second cell matrix at a preset amplification;
   an adder configured to add the output current of the first cell matrix and the output current of the amplifier; and
   an error detector configured to detect a fabrication error, when the apparatus is turned on, by comparing an amount of the output current of the adder with an amount of the output current of the first cell matrix,
   wherein the adder amplifies the output current of the second cell matrix.

2. The apparatus of claim 1, wherein the error detector sets the current output to a reference current when the first cell matrix drives one cell,
   wherein the error detector determines a time when an amount of the output current of the amplifier is equal to an amount of the reference current while changing the number of the cells driven in the second cell matrix, and
   wherein the error detector sets the fabrication error according to a difference between the number of the cells driven in the second cell matrix and the total number of cells of the second cell matrix.

3. The apparatus of claim 1, wherein the error detector controls a bias current source supplied to the second cell matrix according to the detected fabrication error.

4. The apparatus of claim 1, further comprising:
   a first decoder configured to receive the signal corresponding to the number of the MSBs and to convert the input MSB signal to a consecutive-bit signal indicating the number of the cells to drive; and
   a second decoder configured to receive the signal corresponding to the number of the LSBs and to convert the input LSB signal to a consecutive-bit signal indicating the number of the cells to drive,
   wherein the second decoder corrects the input LSB signal using the fabrication error detected by the error detector.

5. The apparatus of claim 4, further comprising:
   a first switching matrix configured to switch a plurality of cells of the first cell matrix according to the consecutive-bit signal converted by the first decoder; and
   a second switching matrix configured to switch a plurality of cells of the second cell matrix according to the consecutive-bit signal converted by the second decoder.

6. The apparatus of claim 1, wherein the first cell matrix and the second cell matrix each comprise a plurality of subcell matrixes which are symmetrical to each other about at least one of a vertical axis and a horizontal axis, and
   wherein each of the plurality of subcell matrixes comprises $2^N-1$-ary cells when the corresponding cell matrix outputs a current corresponding to an N-bit signal.

7. The apparatus of claim 6, wherein the second cell matrix further comprises at least one cell configured to correct the fabrication error.

8. The apparatus of claim 1, wherein, when the second cell matrix outputs the current corresponding to an N-bit signal, the amplifier sets the amplification such that an amount of the output current of one cell of the first cell matrix is $2^N$ times greater than an amount of the output current of one cell of the second cell matrix.

9. The apparatus of claim 1, wherein the adder is a current mirror which adds the output current of the amplifier to an output of the first cell matrix.

10. A method of a digital-analog converter, the method comprising:
    dividing an input digital signal into a Most Significant Bit (MSB) signal corresponding to a number of MSBs and a Least Significant Bit (LSB) signal corresponding to a number of LSBs;
    outputting a current for the MSB signal using a first cell matrix;
    outputting a current for the LSB signal using a second cell matrix;

amplifying the output current using the second cell matrix at a preset amplification;

adding the output current of the first cell matrix and the amplified output current and outputting a result of the adding; and detecting a fabrication error, when the digital-analog converter is turned on, by comparing an amount of the output current of an adder with an amount of the output current of the first cell matrix, wherein the adder amplifies the output current of the second cell matrix.

11. The method of claim 10, wherein the detecting of the fabrication error comprises:

setting the current output to a reference current when the first cell matrix drives one cell;

determining a time when an amount of the output current of the amplifier is equal to an amount of the reference current while changing the number of the cells driven in the second cell matrix; and setting the fabrication error according to a difference between a number of the cells driven in the second cell matrix and a total number of cells of the second cell matrix at the determined time.

12. The method of claim 10, further comprising:

controlling a bias current source supplied to the second cell matrix according to the detected fabrication error.

13. The method of claim 10, further comprising:

converting the MSB signal into a consecutive-bit signal indicating a number of the cells to be driven of the first cell matrix using a first decoder; and converting the LSB signal to a consecutive-bit signal indicating a number of the cells to be driven of the second cell matrix using a second decoder, wherein, when the signal of the certain number of the LSBs is converted to the consecutive-bit signal, the LSB signal is corrected using the detected fabrication error.

14. The method of claim 13, further comprising:

switching a plurality of cells of the first cell matrix using a first switching matrix according to the consecutive-bit signal converted by the first decoder; and switching a plurality of cells of the second cell matrix using a second switching matrix according to the consecutive-bit signal converted by the second decoder.

15. The method of claim 10, wherein the first cell matrix and the second cell matrix each comprise a plurality of subcell matrixes which are symmetrical to each other about at least one of a vertical axis and a horizontal axis, and wherein each of the plurality of subcell matrixes comprises $2^N-1$-ary cells when the corresponding cell matrix outputs a current corresponding to an N-bit signal.

16. The method of claim 15, wherein the second cell matrix further comprises at least one cell for correcting the fabrication error.

17. The method of claim 10, wherein, when the second cell matrix outputs the current for the LSB signal, the amplification is determined such that an amount of the output current of one cell of the first cell matrix is $2^N$ times greater than an amount of the output current of one cell of the second cell matrix.

18. The method of claim 10, wherein the adding and outputting of the output current of the first cell matrix and the amplified output current comprises:

adding the amplified output current to an output of the first cell matrix using a current mirror.

* * * * *